(12) United States Patent  (10) Patent No.: US 8,691,134 B2
Choi  (45) Date of Patent: Apr. 8, 2014

(54) ROLL-TO-ROLL IMPRINT LITHOGRAPHY AND PURGING SYSTEM

(75) Inventor: Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 251 days.

(21) Appl. No.: 13/015,379

(22) Filed: Jan. 27, 2011

(65) Prior Publication Data

US 2011/0183070 A1 Jul. 28, 2011

Related U.S. Application Data

(60) Provisional application No. 61/299,217, filed on Jan. 28, 2010, provisional application No. 61/350,699, filed on Jun. 2, 2010.

(51) Int. Cl.
*B05D 3/12* (2006.01)

(52) U.S. Cl.
USPC ............................. 264/293; 264/496; 977/887

(58) Field of Classification Search
USPC ..................... 264/293, 496; 977/887; 101/287
See application file for complete search history.

(56) References Cited

U.S. PATENT DOCUMENTS

| | | | |
|---|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 8,027,086 B2 | 9/2011 | Guo et al. |
| 2004/0065252 A1 | 4/2004 | Sreenivasan et al. |
| 2004/0065976 A1 | 4/2004 | Sreenivasan et al. |
| 2005/0106321 A1 | 5/2005 | McMackin et al. |
| 2005/0270312 A1 | 12/2005 | Lad et al. |
| 2007/0065532 A1 | 3/2007 | Choi et al. |
| 2007/0114686 A1 | 5/2007 | Choi et al. |
| 2008/0308971 A1 | 12/2008 | Liu et al. |
| 2009/0166914 A1 | 7/2009 | Ogino et al. |
| 2009/0243153 A1 | 10/2009 | Sreenivasan et al. |

FOREIGN PATENT DOCUMENTS

| | | |
|---|---|---|
| EP | 1473594 A2 | 11/2004 |
| EP | 1906236 | 4/2008 |
| EP | 1972997 A2 | 9/2008 |

*Primary Examiner* — Yogendra Gupta
*Assistant Examiner* — Robert J Grun
(74) *Attorney, Agent, or Firm* — Cameron A. King

(57) ABSTRACT

Droplets of polymerizable material may be patterned on a film sheet using a roll-to-roll system. The droplets of polymerizable material may be dispensed on the film sheet such that a substantially continuous patterned layer may be formed on the film sheet. A contact system provides for smooth fluid front progression the polymerizable material during imprinting. A gas purging system may be positioned during imprinting. Gas purging systems may provide for purging in parallel as fluid front of polymerizable material moves through roll-to-roll system.

22 Claims, 9 Drawing Sheets

ROLL-TO-ROLL IMPRINT LITHOGRAPHY AND PURGING SYSTEM

CROSS-REFERENCE TO RELATED APPLICATIONS

The present application claims priority to U.S. Provisional Applications No. 61/299,217 filed Jan. 28, 2010 and No. 61/350,699 filed Jun. 2, 2010, both of which are hereby incorporated by reference in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY OF INVENTION

Methods and systems are provided for patterning polymerizable material. In one aspect, methods include depositing a polymerizable material on a patterning area of a film sheet and contacting the polymerizable material with a template. A contact system opposite the patterning area contacts the film sheet and moves along the film sheet from one edge of the template to the other. The polymerizable material is solidified to form a patterned layer and the template is separated from the patterned area.

In various aspects, the movement of the contact system provides for smooth fluid front progression of the polymerizable material across the patterned area. In one aspect, the contact system can be a roller with a rotational axis parallel to the template. In further aspects the separating can include moving the contact system back to the first edge of the template. In yet other aspects, the film sheet can be repositioned after patterning so that a second patterned area can be imprinted continuous with the first patterned area. In further aspects, multiple templates can be positioned to provide continuous patterning of the film.

In other aspects, a portion of the film sheet is lowered relative to the template to create an open area between the film sheet and the template. A gas purging system is provided within the open area that provides gas at the fluid front. In certain aspects, the gas purging system is moveable relative to the fluid front.

In yet another aspect, a system for patterning polymerizable material on a film sheet is provided having a film sheet coupled to rollers and a template that is moveable to contact a patterning area on the film sheet between the rollers. A contact system positioned substantially parallel to the template and below and in contact with the film sheet is moveable between the sides of the patterning area. In one aspect, the contact system can be a roller with a rotational axis parallel to the template. In another aspect the contact system provides for an air cushion that contacts the film sheet. In further aspects, the contact system is coupled to a motion stage capable of translational movement relative to the film sheet.

In further aspects, gas purging systems are included that are positioned to provide gas between the template and the patterning area of the film sheet. The gas purging systems can likewise be coupled to a motion stage capable of translational movement relative to the film sheet, and can also be moveable at a different speed relative to the contact system.

Aspects and implementations described herein may be combined in ways other than described above. Other aspects, features, and advantages will be apparent from the following detailed description, the drawings, and the claims.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
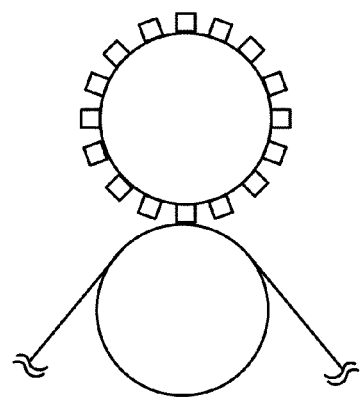
FIG. 1 illustrates a simplified side view of a prior art lithography system.

Referring to the figures, and particularly to FIG. 1, prior art roller assembly systems used in lithography, such as the one shown, employ a template that is difficult to fabricate while retaining fidelity of the pattern intended. For example, when using such a design for the system, the fidelity of the pattern is compromised for templates having features less than sub-100 nm. Additionally, uniform pressure is difficult to achieve, and as such, the features of the pattern formed from such a roller assembly system may be distorted due to the resulting uneven pressure. Improvements have been made in roll-to-roll design such as the system and methods provided in U.S. Publication no. 2009/0243153, which is hereby incorporated by reference in its entirety. Further improvements are described herein.

Figure 2:
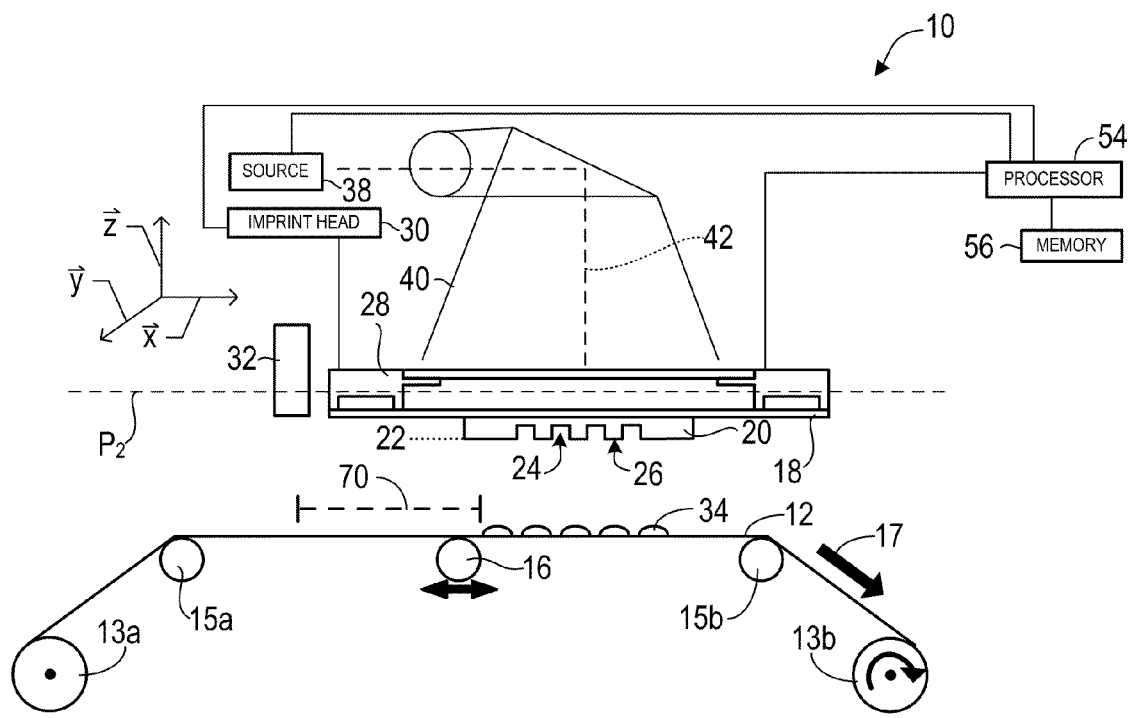
FIG. 2 illustrates a simplified side view of a lithography system in accordance with an embodiment of the present invention.
Figure 3:
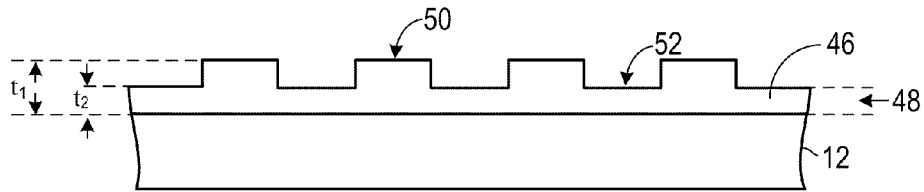
FIG. 3 illustrates an exemplary patterned layer formed on a film sheet using the system of FIG. 2.

Referring to FIGS. 2-3, illustrated therein is a lithographic system 10 used to form a relief pattern on a film sheet 12 in accordance with the present invention. The material of the film sheet 12 may include, but is not limited to, polymeric film, glass, silicon, silicon nitride, Kevlar™ reinforced polymer films, aluminum, and/or similar materials. Thickness of film sheet 12 may be based on design considerations. For example, film sheet 12 may be a thin film sheet 12 with a thickness of approximately 10 μm-500 μm. Film sheet 12 may be highly flexible.

Film sheet 12 may be coupled to one or more rollers 13. In particular, film sheet 12 may be coupled to a supply roller 13*a* and a receiving roller 13*b* with patterning area 14 positioned therebetween. Supply roller 13*a* may provide unpatterned film sheet 12 to patterning area 14. Generally, supply roller 13*a* provides a substantially constant tension across film sheet 12 during imprinting and/or transfer of film sheet in direction of arrow 17. For example, supply roller 13*a* may include a tensional spring providing substantially constant tension across film sheet 12. Receiving roller 13*b* may receive and/or collect patterned film sheet 12. In one embodiment, receiving roller 13*b* may be motor driven.

One or more supporting pulleys 15 may also be included in system 10. For example, supporting pulleys 15*a* and 15*b* may be used to support film sheet 12 during transition of distinct fields of film sheet 12 to patterning area 14. Pulleys 15*a* and 15*b* may be configured to provide additional support to film sheet 12 minimizing general and/or localized deformation of film sheet 12.

Supporting pulleys 15*a* and 15*b* may further facilitate movement of at least a portion of film sheet 12. For example, supporting pulleys 15*a* and 15*b* of FIG. 2 may rotate to facilitate movement of film sheet 12 in the direction of arrow 17 and in a direction opposite of arrow 17. Such movement may selectively provide different fields within patterning area 14 of film sheet 12 in superimposition with template 18.

In one embodiment, supply and receiving rollers 13*a* and/or 13*b* may also include a feedback mechanism in communication with fluid dispense system 32. Feedback mechanism may include rotary encoders providing angular position of axes of each roller 13*a* and 13*b* during imprinting of film sheet 12. Fluid dispense system 32 may use such information in timing of fluid dispense from fluid dispense system 32 and/or speed control of film sheet 12.

In some situations, supply and receiving rollers 13*a* and 13*b* may not provide accurate web speed due to the varying radius of film sheet 12. In these situations, supporting pulleys 15*a* and/or 15*b* may also include a feedback mechanism in communication with fluid dispense system 32 in lieu of or in addition to rollers 13*a* and 13*b*. For example, pulleys 15*a* and/or 15*b* may include a rotary encoder providing feedback to fluid dispense system 32 regarding angular position of axis and/or speed control of film sheet 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein.

Film sheet 12 may be positioned adjacent to a selectively moveable contact system 16. Contact system 16 may be a direct roll contact such as depicted in FIG. 2 with a roller having its axis of rotation parallel to the film sheet. Alternatively, the contact system can be, for example, a support unit with arrays of air nozzles to conform the film to the mold, thus providing an air cushion that contacts the film, or the like. Further, contact system 16 may have a surface that is fairly compliant or air bearing with porous media. In one embodiment, contact system 16 may be coupled to a motion stage providing translations movement of contact system 16 from one side of patterning area 14 to the opposite side of patterning area 14.

During imprinting of polymerizable material 34, contact system 16 moves from a first edge of template 18 to a second edge of template 18 in the direction of arrow 17 from pulley 15*a* to pulley 15*b*. In one embodiment, this movement may be limited to the area in superimposition with template 18. Alternatively, contact system 16 may extend beyond area in superimposition with template 18. For example, movement may be from one side of patterning area 14 to the other side of patterning area 14.

During separation of template 18, contact system 16 moves from second edge of template 18 to first edge of template 18 in a direction opposite of arrow 17 in the direction from pulley 15*b* to pulley 15*a*. In another embodiment, this movement may expand outside of area in superimposition with template 18. For example, movement may be from one side of patterning area 14 to the other side of patterning area 14.

In one embodiment, selectively moveable contact system 16 may be positioned substantially in parallel with template 18. For example, contact system 16 may be positioned substantially in parallel with template 18 during contact of template 18 with the section of film sheet 12 having polymerizable material 34 positioned thereon. Contact system 16 may also be positioned substantially in parallel with template 18 during movement of contact system 16 from one side of patterning area 14 to the other side of patterning area 14. It should be noted that contact system 16 may be raised and/or lowered during movement during movement of contact 16 from one side of patterning area to the other side of patterning area 14.

Template 18 may include mesa 20 extending therefrom towards film sheet 12, with mesa 20 having a patterning surface 22 thereon. Mesa 20 may be referred to as mold 20 or imprint mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. Thickness of template 18 may be based on design considerations. In one embodiment, template 18 may have a thickness of approximately 0.5 mm.

As illustrated in FIGS. 2-3, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on film sheet 12. Alternatively, patterning surface 22 may be substantially smooth and/or planar.

Figure 4:
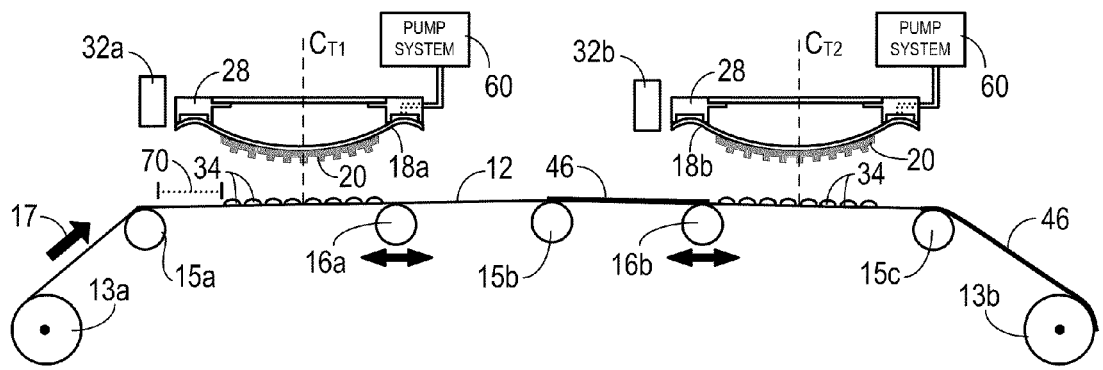
FIG. 4 illustrates a simplified side view of another exemplary lithography system in accordance with an embodiment of the present invention.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18. In one embodiment, system 10 may include a plurality of templates 18. For example, as illustrated in FIG. 4, system 10 may include multiple templates 18a and 18b.

System 10 may further comprise one or more fluid dispense systems 32. Fluid dispense system 32 may be used to deposit polymerizable material 34 on film sheet 12. Polymerizable material 34 may be positioned upon film sheet 12 using techniques such as drop dispense, spin-coating, dip coating, chemical vapor deposition (CVD), physical vapor deposition (PVD), thin film deposition, thick film deposition, and/or the like. For example, polymerizable material 34 may be positioned upon film sheet 12 using techniques such as those described in U.S. Patent Publication No. 2005/0270312 and U.S. Patent Publication No. 2005/0106321, both of which are hereby incorporated by reference herein.

In one embodiment, polymerizable material 34 may be deposited upon film sheet 12 as a plurality of spaced apart droplets. For example, polymerizable material 34 may be deposited droplets with each droplet having a unit volume between approximately 1-200 picoliters. Droplets of polymerizable material 34 may be disposed on film sheet 12 according to a drop pattern. Drop pattern may be based on design considerations and/or determined to provide specific characteristics such as those described in U.S. Patent Publication No. 2005/0270312, which is hereby incorporated by reference herein.

Polymerizable material 34 may comprise a monomer mixture as described in U.S. Pat. No. 7,157,036 and U.S. Patent Publication No. 2005/0187339, both of which are hereby incorporated by reference herein. Additionally, to facilitate wetting and/or adhesion after imprinting, film sheet 12 may be treated with a composition described in U.S. Patent Publication No. 2007/0114686, which is hereby incorporated by reference herein.

Referring to FIGS. 2-3, system 10 may further comprise an energy source 38 coupled to direct energy 40 along path 42. In one embodiment, energy source 38 may include an in-line UV source (e.g., UV LEDs, Hg line lamp, or the like). In another embodiment, energy source 38 may be an Hg lamp with flood exposure such that path 42 covers the full exposure area.

Figure 6A:
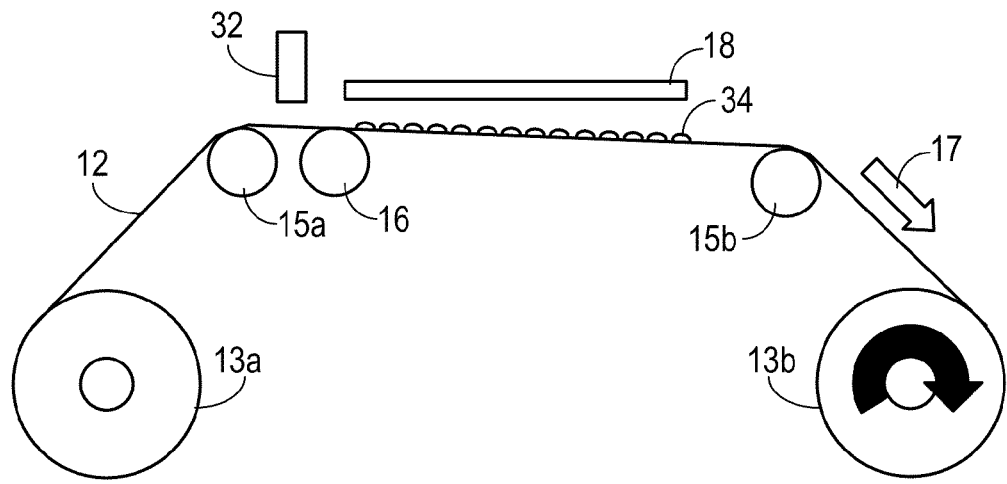
FIGS. 6A-6D illustrate simplified side views of an exemplary lithography system in accordance with an embodiment of the present invention forming a patterned layer of a film sheet.

Referring to FIGS. 2, 3, and 6A imprint head 30, rollers 13a and 13b, and/or pulleys 15a and 15b may be configured to position template 18 and a first portion of film sheet 12 having polymerizable material 34 deposited thereon in superimposition with path 42. System 10 may be regulated by processor 54 in communication with rollers 13a and 13b, imprint head 30, fluid dispense system 32, pump system 60 and/or source 38, and may operate on a computer readable program stored in memory 56. Once film sheet 12 is positioned in a desired position, pulley 13a may be provided in a locked position, and pulley 13b may provide constant tension to film sheet 12.

Figure 6B:
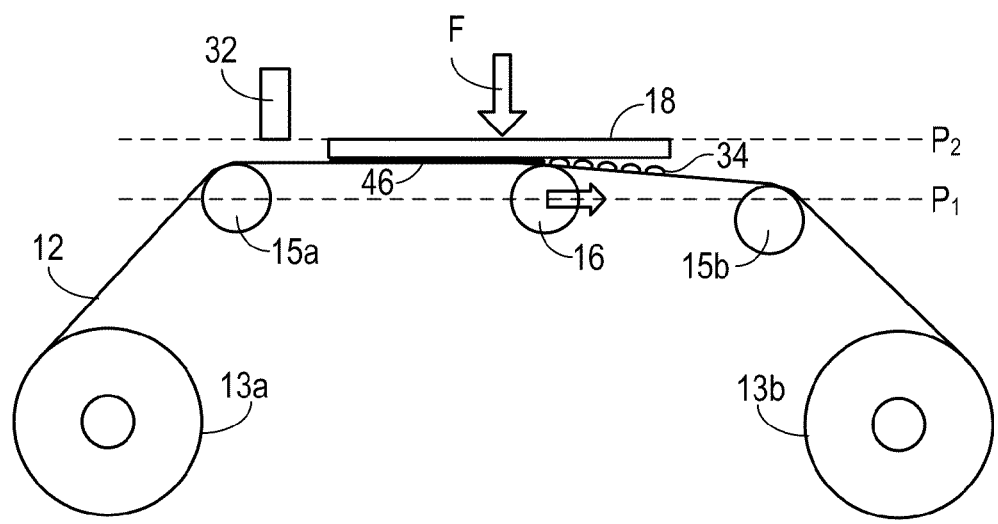

Referring to FIGS. 2, 3 and 6B, imprint head 30 and/or contact system 16 may vary a distance between mold 20 and film sheet 12 to define a desired volume therebetween that is filled by polymerizable material 34. For example, imprint head 30 may apply a force F to template 18 such that mold 20 contacts polymerizable material 34. Additionally, contact system 16 may be positioned substantially parallel to template 18 and selectively move from one edge of template 18 to the opposite edge of template 18 applying a force on substrate 12. As contact system 16 is positioned substantially parallel to template 18, contact system 16 may align film sheet 12 such that film sheet 12 is positioned substantially parallel with template 18 filling desired volume with polymerizable material 34.

Figure 6C:
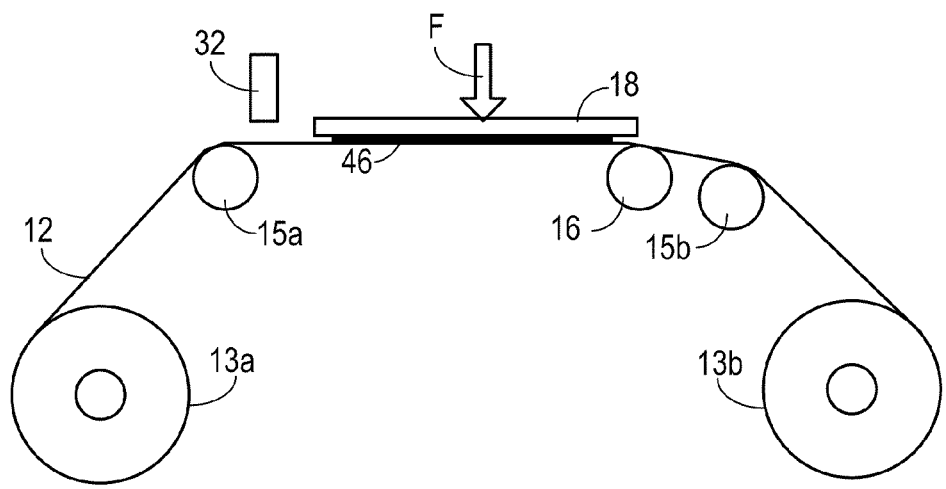

Referring to FIGS. 2, 3 and 6C, after the desired volume is filled with polymerizable material 34, source 38 produces energy 40, e.g., ultraviolet radiation, causing polymerizable material 34 to solidify and/or cross-link conforming to a shape of film sheet 12 provided by contact system 16 and patterning surface 22 of template 18, defining patterned layer 46 on film sheet 12. Patterned layer 46 may comprise a residual layer 48 and a plurality of features shown as protrusions 50 and recessions 52, with protrusions 50 having a thickness $t_1$ and residual layer having a thickness $t_2$ as illustrated in FIG. 3. Energy 40 may be produced after contact system 60 reaches the opposite side of template 18. Alternatively, energy 40 may be produced on portions of film sheet 12 wherein contact system 60 passes even prior to reaching opposite side of template 18. For example, a scanning energy 40 may move along with contact system 60 (e.g., at substantially similar speed).

Figure 6D:
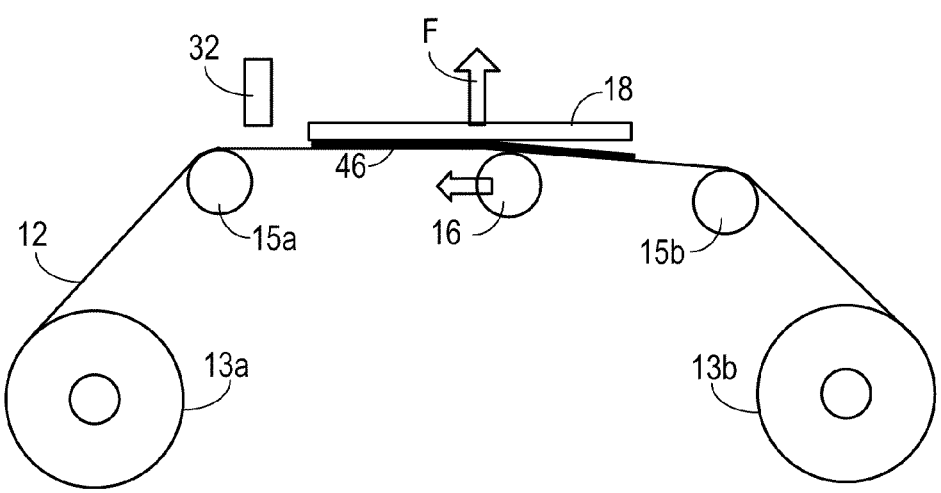

Referring to FIGS. 2, 3, and 6D after patterning a portion of film sheet 12, contact system 16 may aid in separation of patterned layer 46 from template 18. For example, contact system 16 may apply an upward force to film sheet 12 as contact system 16 returns to its original position while pulley 15b moves downward. Additionally, imprint head 30 may be moved in upward direction applying an upward force F to film sheet 12. This upward force may be in addition to or in lieu of upward force applied to film sheet 12 by contact system 16. Additionally, the force applied by contact system 16 may be reduced as contact system 16 moves towards its original position. Tensioning of film sheet 12 provided by rollers 13a and 13b and an upward force F applied by template 18 and/or contact system 16 may aid in separating patterned layer 46 from template 18.

Once patterned layer 46 is separated from template 18, rollers 13a and 13b and/or pulleys 15a and 15b may facilitate movement of film sheet 12 providing another section of film sheet in superimposition with template 18. This process may be repeated as many times as desired.

In one embodiment, patterned layer 46 may be protected by a protective film as described in U.S. Patent Publication No. 2008/0308971, which is hereby incorporated by reference herein. Such a protective film may provide for re-capturing of film sheet 12 onto pulley 13b without damage to patterned layer 46 and/or subsequent fabricated patterns on film sheet 12. For example, material may be deposited on patterned layer 46 and/or subsequent fabricated patterns on film sheet 12, solidified, and recaptured into pulley 13b for storage of film sheet 12. In another embodiment, imprinted portions of film sheet 12 may be cut into separated pieces while remaining film sheet 12 is positioned in pulley 13b. This process step may occur between pulleys 15b and 13b.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, all of which are hereby incorporated by reference herein.

As illustrated in FIG. 2, generally there exists a gap distance 70 between fluid dispense system 32 and template 18 wherein polymerizable material 34 is absent on substrate 12. Due to this gap distance 70, imprint fields on film sheet 12 will also be spaced apart as film sheet 12 is advanced during imprinting.

In one embodiment, the effect of gap distance 70 may be significantly reduced or eliminated by moving film sheet 70 in a direction opposite to arrow 17 subsequent to imprinting each section of film sheet 12. By moving film sheet 12 in the opposite direction a distance at least equivalent to gap distance 70, film sheet 12 may be repositioned and realigned with fluid dispense system 32 reducing or eliminating the effect of gap distance 70 and thereby providing for a continuous patterned layer on substrate 12. Dispensing of polymerizable material 34 may be done at a constant speed or a varying speed.

Figure 5:
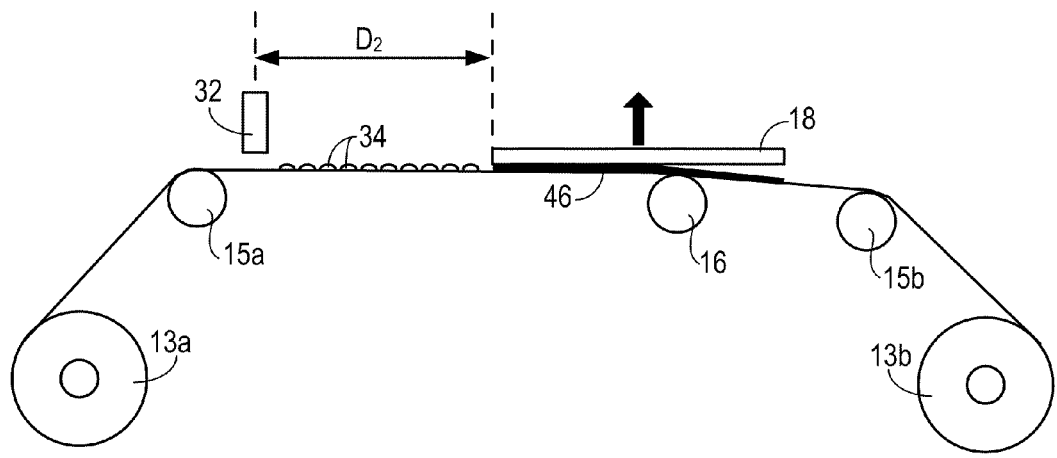
FIG. 5 illustrates a simplified side view of another exemplary lithography system in accordance with an embodiment of the present invention.

In another embodiment, the effect of gap distance 70 may be significantly reduced or eliminated by providing a pre-dispensing process for portion of gap distance 70. FIG. 5 illustrates an exemplary pre-dispensing process wherein fluid dispense system 32 may be positioned at a distance $D_2$ from edge of template 18. Distance $D_2$ may be equal to the length of the field size being imprinted. As such, the distance between fluid dispense system 32 and the center of the field being patterned is approximately one and a half times the field size being imprinted. Dispensing of polymerizable material 34 may be done at a constant speed or a varying speed. For example, dispensing of polymerizable material 34 may be at a varying speed to compensate for evaporation.

Alternatively, the effect of gap distance 70 may be significantly reduced or eliminated by providing a parallel process with multiple templates 17 (e.g., templates 18a and 18b illustrated in FIG. 4). For example, to eliminate the effect of gap distance 70 and form a continuous patterned layer 46, distance between center $C_{T1}$ of template 18a and center $C_{T2}$ of template 18b is substantially equal to three times the length of a field of substrate 12. Additionally, fluid dispense system 32 may be positioned at a distance equal to one field length from edge of template 18.

Figure 7:
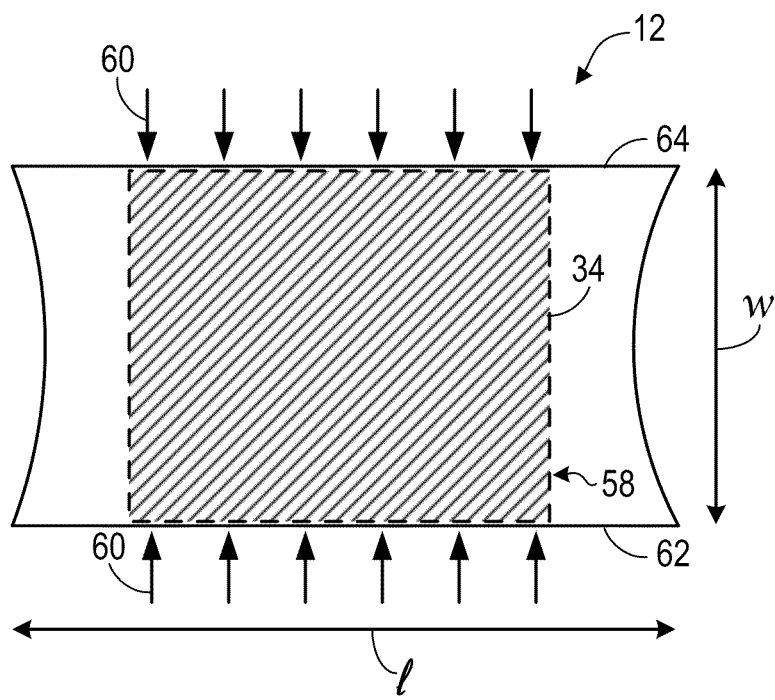
FIG. 7 illustrates a top down view of purging outlets positioned along the length of a film sheet.

For large area imprinting, it may be difficult to provide a uniform and/or high purity gas purging. For example, as illustrated in FIG. 7, due to the size of film sheet 12 and/or field 58 being imprinted, purging outlets 60 may need to be located at a first boundary 62 and/or at a second boundary 64 of film sheet 12. First boundary 62 and second boundary 64 extend the length L of film sheet 12. Positioning of outlets 60 at first boundary 62 and/or second boundary 64, however, may lead to increased purging times due to the large width w. For example, gas may "escape" along width w of film sheet 12. As such, an increased volume of purging gas may be required to compensate and/or uneven fluid evaporation of polymerizable material 34 may result from the flow of purging gas from boundaries 62 and 64. This may further result in decreased throughput of system 10.

Figures 10A, 10B:
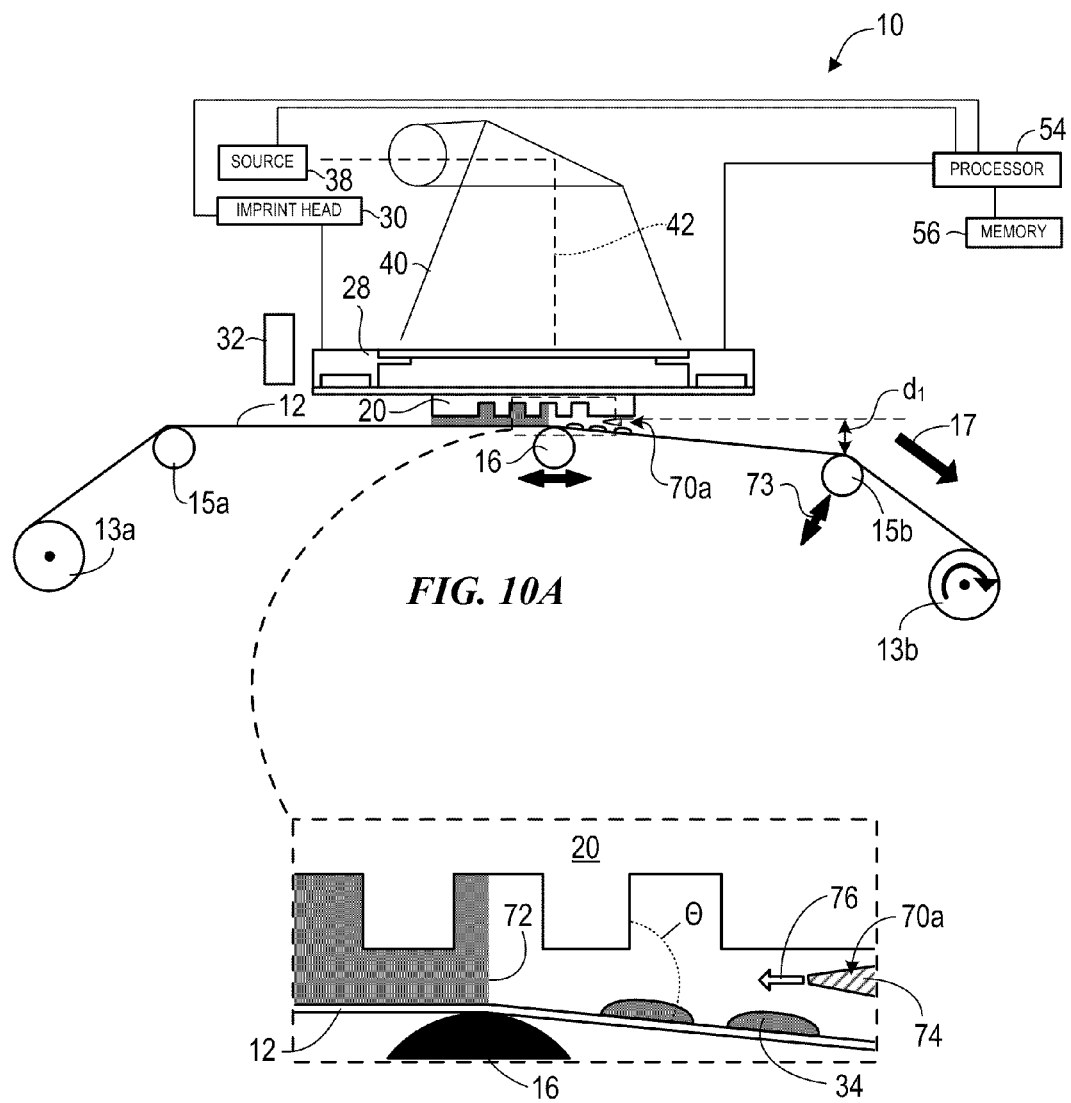
FIG. 10A illustrates simplified side views of the purging system illustrated in FIGS. 8 and 9 during a nano imprinting process.
FIG. 10B illustrates a magnified view of the purging system illustrated in FIG. 10A during a nano imprinting process.
Figure 11:
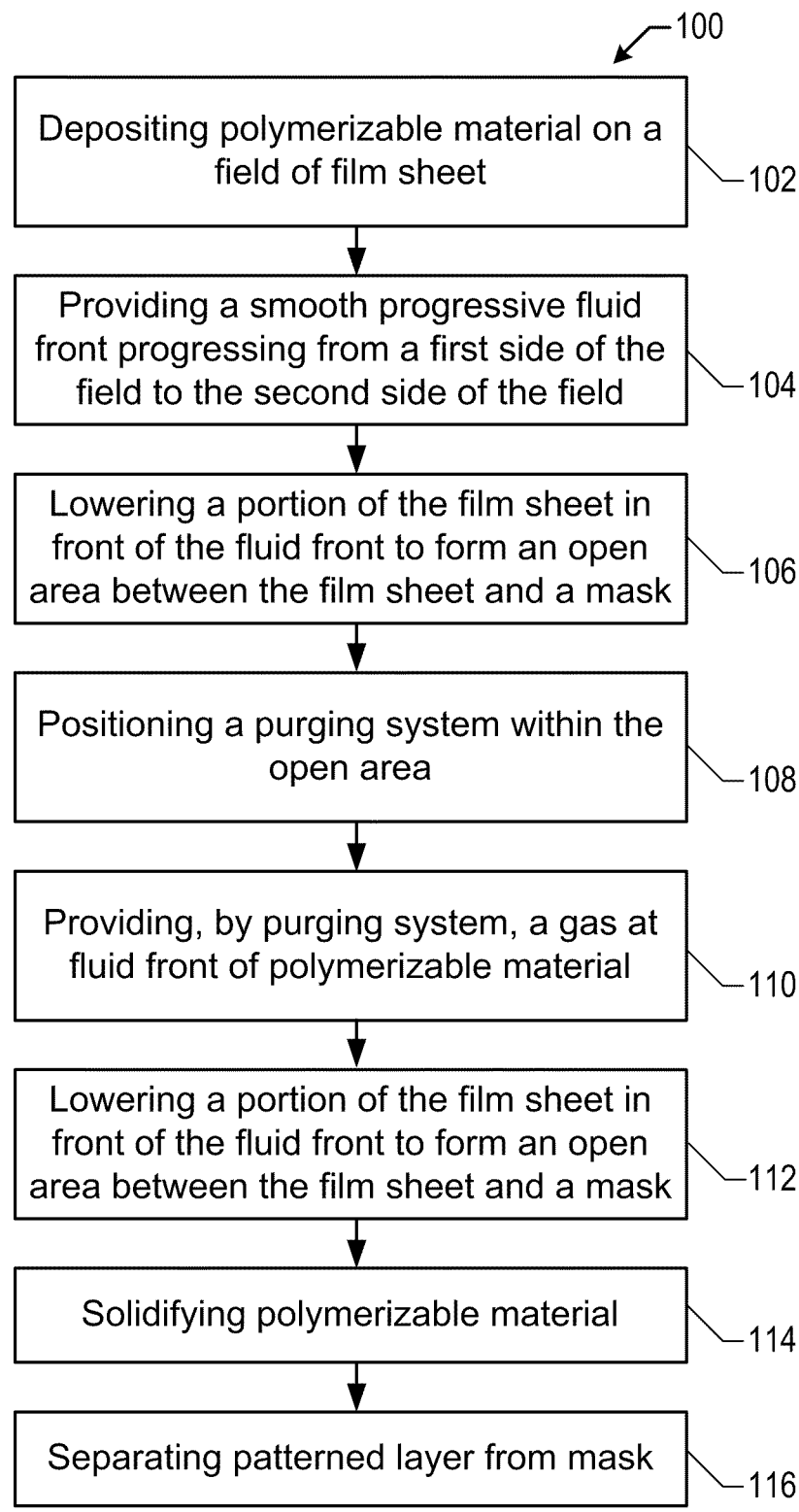
FIG. 11 illustrates an exemplary method of a nano imprinting process using a purging system in accordance with the present invention.
Figure 12:
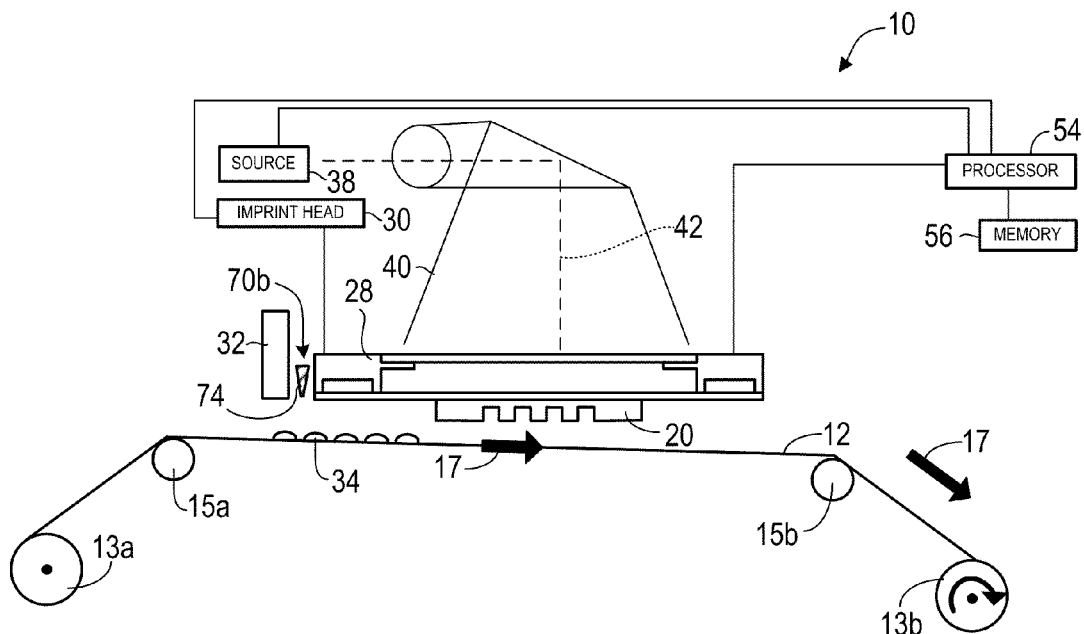
FIG. 12 illustrates a simplified side view of another exemplary purging system in accordance within the present invention.

Referring to FIGS. 8-13, gas purging systems 70 and methods for imprinting continuous film sheets 12 (i.e., roll-to-roll imprinting) are herein provided. Generally, such systems 70 provide for gas purging system 70 to provide gas substantially in parallel to fluid front 72 of polymerizable material 34 as fluid front 72 moves from one side of patterning area 14 to the other side of patterning area 14 (FIG. 2) as described above. Purging systems 70 may be forward fluid front 72 (FIG. 9) or reverse fluid front 72 (FIG. 12).

Figure 8:
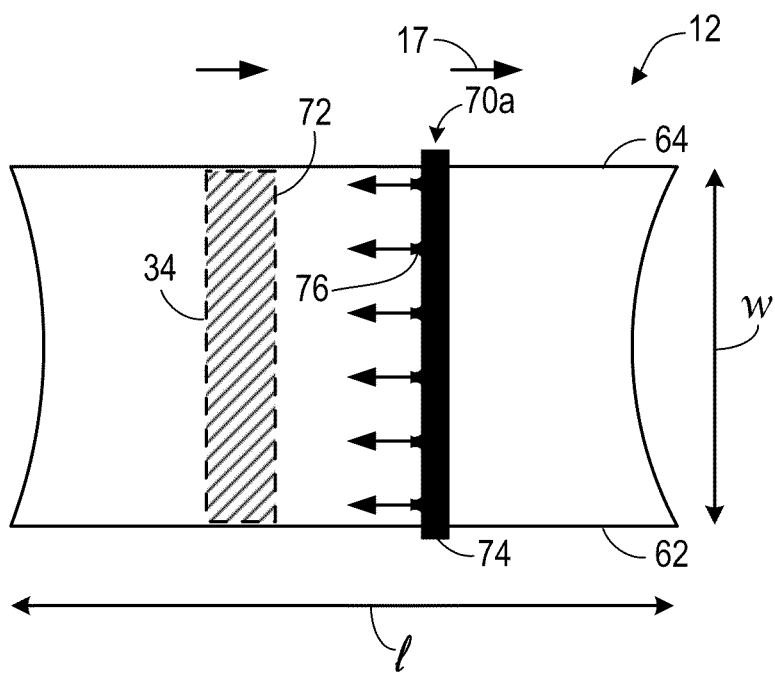
FIG. 8 illustrates a top down view of an exemplary purging system in accordance with the present invention.
Figure 9:
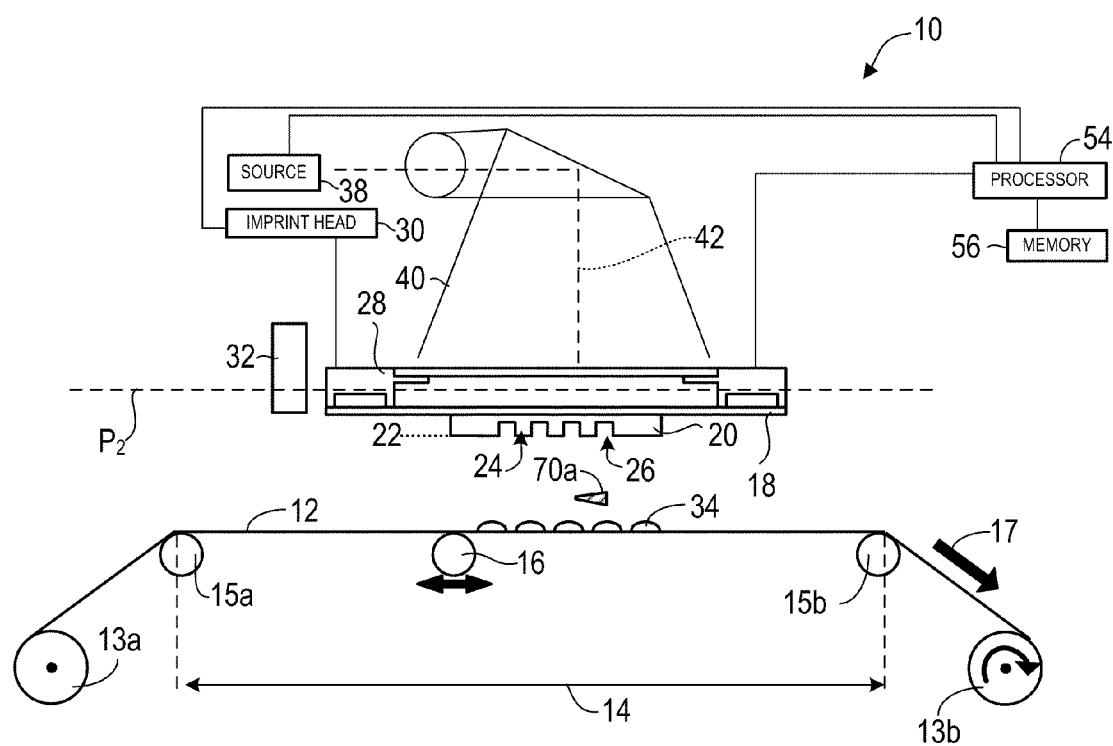
FIG. 9 illustrates a simplified side view of the purging system illustrated in FIG. 8.

FIGS. 9-8 illustrate an exemplary embodiment of a forward fluid front gas purging system 70a for continuous film sheet 12. Gas purging system 70a may include a longitudinal body 74 having one or more nozzles 76 configured to provide gas between template 18 and film sheet 12. Longitudinal body 74 of gas purging system 70a may be attached to a motion stage. Motion stages are generally known within the art and as such are not discussed in detail herein. In one embodiment, longitudinal body 74 of gas purging system 70a may be attached to same motion stage as contact system 16. Motion stage may provide for purging system 70a to move at a substantially similar speed as fluid front 72. Alternatively, motion stage may provide for purging system 70a to move at a substantially different speed as fluid front 72.

Referring to FIGS. 10A and 10B, contact system 16 may move from one side of imprinting field to the other side of imprinting field generating a substantially smooth fluid front 72. Portion of film sheet 12 may form an angle Θ with respect to mask 20. For example, pulley 15b may be selectively movable in direction 73 such that film sheet 12 is lowered by a distance $d_1$ providing film sheet 12 at angle Θ with respect to mask 20. Spaced formed by angle Θ provides an open area between film sheet 12 and mask 20 in which gas purging system 70a may be positioned. Positioning gas purging system 70a between mask 20 and film sheet 12 within space provided by angle Θ may provide substantial uniformity in contact between polymerizable material 34 and gas from purging system 70a as compared to positioning of a purging system at boundaries of film sheet 12 as described and illustrated with respect to FIG. 7. Additionally, by positioning purging system 70a substantially near fluid front 72 as compared to positioning a purging system at boundaries of film sheet 12, purging efficiency may be increased.

FIG. 11 illustrates an exemplary method 100 for purging area between film sheet 12 and mask 20 during imprinting. In a step 102, polymerizable material 34 may be deposited on a field of film sheet 12. In a step 104, contact system 16 may move from a first side of field to a second opposite side of field. Contact system 16 may provide a smooth progressive fluid front 72 progressing from first side of field to second side of field. In a step 106, a portion of film sheet 12 in front of fluid front 72 may be lowered to form an angle Θ with respect to mask 20 providing an open area between film sheet 12 and mask 20. In a step 108, purging system 70a may be positioned within open area between film sheet 12 and mask 20. In a step 110, purging system 70a may provide gas at fluid front 72 of polymerizable material 34. In a step 112, purging system 70a may move relative to fluid front 72 of polymerizable material 34 from first side of field to second side of field. In one example, purging system 70a may move at substantially the same speed as fluid front 72 of polymerizable material 34 moves from first side of field to second side of field. In a step 114, polymerizable material 34 may be solidified forming patterned layer 46. In a step 116, contact system 16 and purging system 70a may return to initial positions providing a separation motion for separating patterned layer 46 and mask 22.

FIG. 12 illustrates another embodiment of gas purging system 70b. Gas purging system 70b may be positioned behind fluid front 72 between fluid dispense system 32 and template 18. This is contrasted with positioning of gas purging system 70a in front of fluid front 72 as illustrated in FIGS. 8-11. Fluid dispense system 32 may dispense polymerizable material 34 on film sheet 12. As film sheet 12 (having polymerizable material 34 positioned thereon) moves in direction 17 below mask 20, purging system 70b may provide purging gas adjacent to mask 20 and within gap between mask 20 and film sheet 12. For example, by providing purging gas adjacent to mask 20 and through movement of film sheet 12 in direction 17, purging gas may be pulled within gap between film sheet 12 and mask 20.

Figure 13:
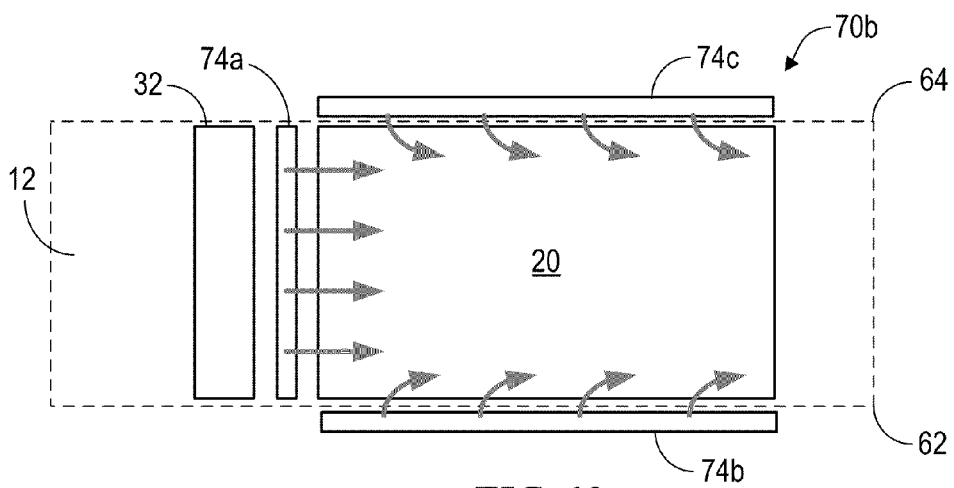
FIG. 13 illustrates a top down view of the purging system illustrated in FIG. 12.

Purging system 70b may include one or more longitudinal bodies 74 positioned about field of film sheet 12 to be imprinted. For example, purging system 70b, as illustrated in FIG. 13 includes three longitudinal bodies 74a-c. A first longitudinal body 74a is positioned behind fluid front while second and third longitudinal bodies 74b and 74c are positioned at boundaries 62 and 64 of film sheet 12. Second and third bodies may provide compensation for boundary disturbances and may aid in containing gas provided by first body 74 within imprinting field.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method of patterning polymerizable material on a film sheet comprising the steps of:
    (a) depositing a polymerizable material on a patterning area of the film sheet;
    (b) positioning the patterning area of the film sheet with the deposited polymerizable material in superimposition with a template, the template having first and second opposing edges;
    (c) then contacting the deposited polymerizable material with the template;
    (d) contacting the film sheet opposite the patterning area with a contact system, with the contact system oriented parallel to the first and second edges of the template; translating the contact system along the film sheet from the first edge of the template to the second edge of the template;
    (e) solidifying the polymerizable material to form a patterned layer; and
    (f) separating the template from the patterned layer.

2. The method of claim 1 wherein the contact system is a roller with an axis of rotation parallel to the first and second edges of the template.

3. The method of claim 1 wherein the separating step further comprises translating the contact system from the second edge of the template back to the first edge of the template.

4. The method of claim 1 wherein the translation of the contact system from the first edge of the template to the second edge of the template creates a fluid front formed of the polymerizable material that progresses from a first side of the patterned area to a second side of the patterned area.

5. The method of claim 4 further comprising lowering a portion of the film sheet relative to the template to create an open area between the film sheet and the template.

6. The method of claim 5 further comprising providing a gas purging system within the open area that provides gas at the fluid front.

7. The method of claim 6 wherein the gas purging system is moveable relative to the fluid front.

8. The method of claim 1 further comprising the step of repositioning the film sheet after separating the template from the patterned layer to a location relative to the template such that second patterned layer can be formed that is continuous with the first patterned layer.

9. The method of claim 8 wherein the deposition of the polymerizable material occurs at a gap distance from the first edge of the template, and wherein the film sheet is repositioned over a distance at least equal to the gap distance.

10. The method of claim 1 wherein the deposition of the polymerizable material occurs at a distance from the first edge of the template that is equivalent to the distance between the first and second template edges.

11. The method of claim 1 further comprising at least two templates and wherein the at least two templates are positioned at a distance relative to each other that provides for continuous patterning of the film sheet.

12. The method of claim 11 wherein the two templates are positioned at a distance equal to three times the length of the patterning area.

13. A method of patterning polymerizable material on a film sheet comprising the steps of:
    (a) depositing a polymerizable material on a patterning area of the film sheet;
    (b) contacting the deposited polymerizable material with a template, the template having first and second edges;
    (c) contacting the film sheet opposite the patterning area with a roller having an axis of rotation parallel to the first and second edges of the template;
    (d) translating the roller along the film sheet from the first edge of the template to the second edge of the template;
    (e) solidifying the polymerizable material to form a patterned layer; and
    (f) separating the template from the patterned layer.

14. The method of claim 13 wherein the contacting the deposited polymerizable material with a template further comprises applying a force to the template.

15. The method of claim 13 wherein the contacting the deposited polymerizable material with a template further comprises applying a force to the template.

16. The method of claim 13 wherein the translation of the roller from the first edge of the template to the second edge of the template creates a fluid front formed of the polymerizable material that progresses from a first side of the patterned area to a second side of the patterned area, and wherein a purging gas is provided at the fluid front.

17. The method of claim 16 wherein the purging gas is provided by a gas purging system that is moveable relative to the fluid front.

18. A method of patterning polymerizable material on a film sheet comprising the steps of:
    (a) depositing a polymerizable material on a patterning area of the film sheet;

(b) contacting the deposited polymerizable material with a template the template having first and second edges;
(c) contacting the film sheet opposite the patterning area with a roller having an axis of rotation parallel to the first and second edges of the template;
(d) translating the roller along the film sheet from the first edge of the template to the second edge of the template;
(e) solidifying the polymerizable material to form a patterned layer; and
(f) translating the roller from second edge of the template to the first edge of the template to separate the template from the patterned layer.

19. The method of claim 18 wherein the contacting the deposited polymerizable material with a template further comprises applying a force to the template.

20. The method of claim 18 wherein the contacting the deposited polymerizable material with a template further comprises applying a force to the template.

21. The method of claim 18 wherein the translation of the roller from the first edge of the template to the second edge of the template creates a fluid front formed of the polymerizable material that progresses from a first side of the patterned area to a second side of the patterned area, and wherein a purging gas is provided at the fluid front.

22. The method of claim 21 wherein the purging gas is provided by a gas purging system that is moveable relative to the fluid front.

* * * * *